(12) United States Patent
Nagashima et al.

(10) Patent No.: US 10,665,598 B2
(45) Date of Patent: May 26, 2020

(54) SEMICONDUCTOR MEMORY DEVICE AND METHOD FOR MANUFACTURING SAME

(71) Applicant: TOSHIBA MEMORY CORPORATION, Minato-ku (JP)

(72) Inventors: Satoshi Nagashima, Yokkaichi (JP); Shinya Arai, Yokkaichi (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 16/128,655

(22) Filed: Sep. 12, 2018

(65) Prior Publication Data

US 2019/0326309 A1 Oct. 24, 2019

(30) Foreign Application Priority Data

Apr. 19, 2018 (JP) .................................. 2018-080431

(51) Int. Cl.
*H01L 27/11556* (2017.01)
*H01L 27/11519* (2017.01)
(Continued)

(52) U.S. Cl.
CPC .... *H01L 27/11556* (2013.01); *H01L 21/7682* (2013.01); *H01L 27/11519* (2013.01);
(Continued)

(58) Field of Classification Search
CPC ......... H01L 27/11556; H01L 27/11573; H01L 21/7682; H01L 27/11582; H01L 27/11575; H01L 27/11565; H01L 27/11548; H01L 27/11529; H01L 27/11519; H01L 21/32137; H01L 21/32136
See application file for complete search history.

(56) References Cited

U.S. PATENT DOCUMENTS 7,615,460 B2   11/2009 Ueda
8,476,713 B2   7/2013 Lee et al.
(Continued)

FOREIGN PATENT DOCUMENTS

JP   2006-319058   11/2006
JP   2010-098067   4/2010
(Continued)

*Primary Examiner* — David Vu
(74) *Attorney, Agent, or Firm* — Oblon, McClelland, Maier & Neustadt, L.L.P.

(57) ABSTRACT

A semiconductor memory device includes a substrate, a plurality of first electrode layers, a semiconductor layer, a plurality of second electrode layers, and a conductor. The plurality of first electrode layers are arranged to be separated from each other in a first direction above the substrate. The semiconductor layer extends through the plurality of first electrode layers in the first direction. The plurality of second electrode layers are arranged to be separated from each other in the first direction, arranged to be separated from the plurality of first electrode layers in a second direction crossing the first direction, and arranged at substantially the same levels as levels of the plurality of first electrode layers in the first direction. The conductor electrically connects the plurality of second electrode layers to each other. The plurality of second electrode layers are connected in parallel by the conductor.

16 Claims, 9 Drawing Sheets

(51) Int. Cl.
*H01L 27/11529* (2017.01)
*H01L 27/11548* (2017.01)
*H01L 27/11565* (2017.01)
*H01L 27/11575* (2017.01)
*H01L 27/11582* (2017.01)
*H01L 21/768* (2006.01)
*H01L 27/11573* (2017.01)
*H01L 21/3213* (2006.01)

(52) U.S. Cl.
CPC .. *H01L 27/11529* (2013.01); *H01L 27/11548* (2013.01); *H01L 27/11565* (2013.01); *H01L 27/11573* (2013.01); *H01L 27/11575* (2013.01); *H01L 27/11582* (2013.01); *H01L 21/32136* (2013.01); *H01L 21/32137* (2013.01)

(56) References Cited

U.S. PATENT DOCUMENTS

| | | |
|---|---|---|
| 9,698,151 B2 * | 7/2017 | Lee ............... H01L 27/11565 |
| 2009/0258469 A1 | 10/2009 | Ueda |
| 2010/0090188 A1 | 4/2010 | Futatsuyama |
| 2015/0036407 A1 | 2/2015 | Nakajima |
| 2016/0126251 A1 | 5/2016 | Fujita et al. |

FOREIGN PATENT DOCUMENTS

| | | |
|---|---|---|
| JP | 2015-028989 | 2/2015 |
| JP | 2019-114698 A | 7/2019 |

* cited by examiner

SEMICONDUCTOR MEMORY DEVICE AND METHOD FOR MANUFACTURING SAME

CROSS-REFERENCE TO RELATED APPLICATIONS

This application is based upon and claims the benefit of priority from Japanese Patent Application No.2018-080431, filed on Apr. 19, 2018; the entire contents of which are incorporated herein by reference.

FIELD

Embodiments relate to a semiconductor memory device and a method for manufacturing the same.

BACKGROUND

There is a semiconductor memory device that includes three-dimensionally arranged memory cells. For example, a NAND memory device includes a memory hole piercing multiple electrode layers in the stacking direction of the multiple electrode layers. The memory cells are provided in the interior of the memory hole and are disposed at portions where the electrode layers cross a semiconductor layer extending in the stacking direction of the multiple electrode layers. In the manufacturing processes of such a memory device, it becomes difficult to form the memory holes as the number of stacks of electrode layers increases.

DETAILED DESCRIPTION

Figure 1A:
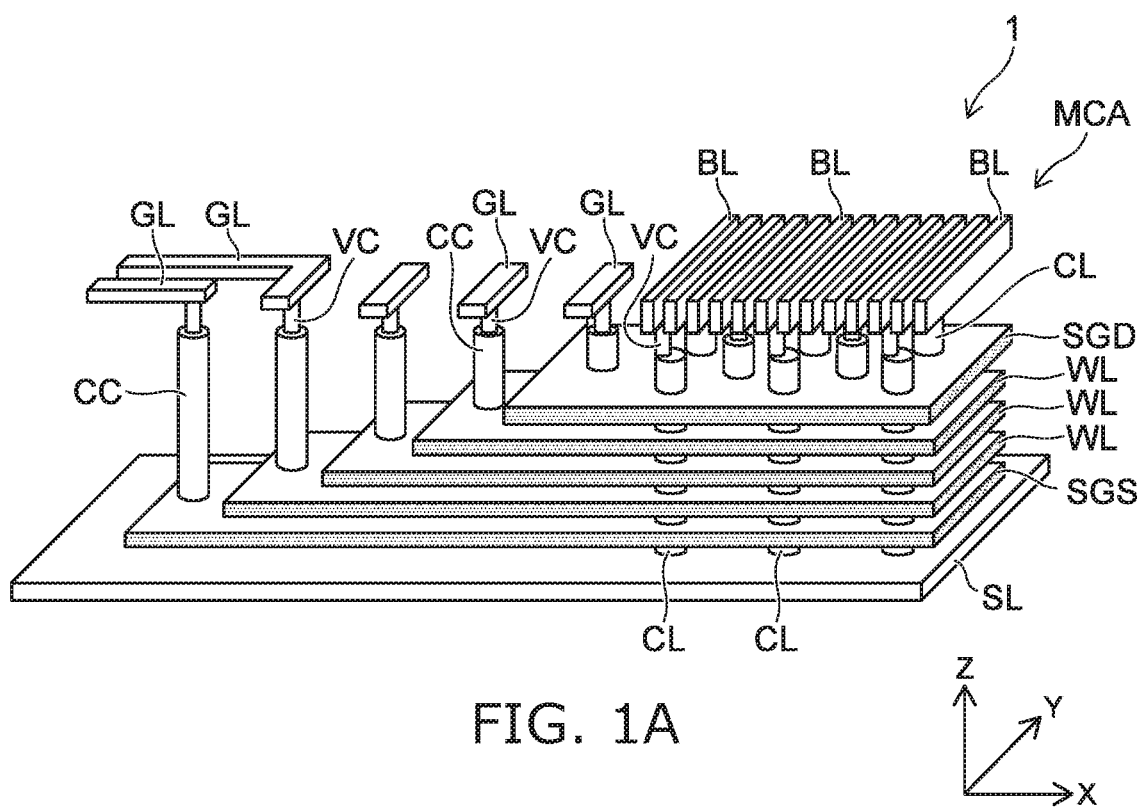
FIGS. 1A and 1B are schematic views showing a semiconductor memory device according to a first embodiment.

According to one embodiment, a semiconductor memory device includes a substrate, a plurality of first electrode layers, a semiconductor layer, a plurality of second electrode layers, and a conductor. The plurality of first electrode layers are arranged to be separated from each other in a first direction crossing an upper surface of the substrate above the substrate. The semiconductor layer extends through the plurality of first electrode layers in the first direction. The plurality of second electrode layers are arranged to be separated from each other in the first direction, arranged to be separated from the plurality of first electrode layers in a second direction crossing the first direction, and arranged at substantially the same levels as levels of the plurality of first electrode layers in the first direction. The conductor electrically connects the plurality of second electrode layers to each other. The plurality of second electrode layers are connected in parallel by the conductor.

Embodiments will now be described with reference to the drawings. The same portions inside the drawings are marked with the same numerals; a detailed description is omitted as appropriate; and the different portions are described. The drawings are schematic or conceptual; and the relationships between the thicknesses and widths of portions, the proportions of sizes between portions, etc., are not necessarily the same as the actual values thereof. The dimensions and/or the proportions may be illustrated differently between the drawings, even in the case where the same portion is illustrated.

There are cases where the dispositions of the components are described using the directions of XYZ axes shown in the drawings. The X-axis, the Y-axis, and the Z-axis are orthogonal to each other. Hereinbelow, the directions of the X-axis, the Y-axis, and the Z-axis are described as an X-direction, a Y-direction, and a Z-direction. Also, there are cases where the Z-direction is described as upward and the direction opposite to the Z-direction is described as downward.

First Embodiment

Figure 1B:
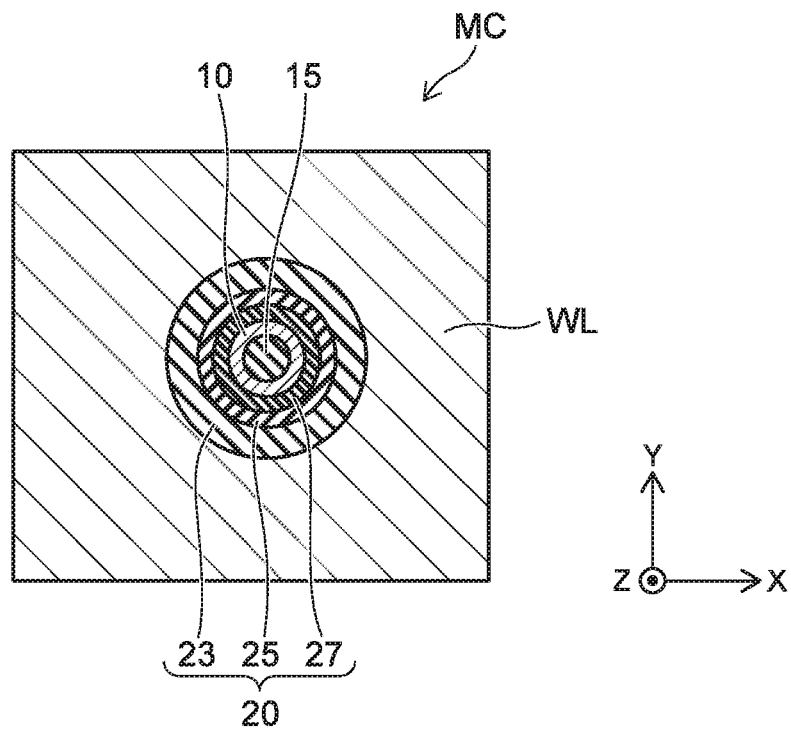

FIGS. 1A and 1B are schematic views showing a semiconductor memory device 1 according to a first embodiment. The semiconductor memory device 1 is, for example, a NAND memory device including three-dimensionally arranged memory cells MC. FIG. 1A is a perspective view showing a memory cell array MCA of the semiconductor memory device 1. Insulating films are not illustrated in FIG. 1A to show the configuration of the semiconductor memory device 1. FIG. 1B is a plan view showing the memory cells MC of the semiconductor memory device 1.

As shown in FIG. 1A, the semiconductor memory device includes a source layer SL, multiple electrode layers (hereinbelow, word lines WL and select gates SGS and SGD), and columnar bodies CL. The select gate SGS, the word lines WL, and the select gate SGD are arranged to be separated from each other above the source layer SL. The columnar bodies CL extend in the Z-direction and pierce the select gate SGS, the word lines WL, and the select gate SGD. Hereinbelow, there are cases where the select gate SGS, the word lines WL, and the select gate SGD are described comprehensively as the "electrode layers." The other components are described similarly.

The columnar bodies CL are connected to the source layer SL. The columnar bodies CL are connected via connection plugs VC to bit lines BL disposed above the select gate SGD. The memory cells MC are disposed at portions where the columnar bodies CL and the word lines WL cross.

As shown in FIG. 1B, the columnar body CL includes a semiconductor layer 10, an insulating core 15, and a memory film 20. The semiconductor layer 10 is, for example, a polysilicon layer. The insulating core 15 is, for example, silicon oxide. The semiconductor layer 10 is provided to surround the insulating core 15.

The semiconductor layer 10 functions as channel layers of the memory cells MC. The memory film 20 is positioned between the semiconductor layer 10 and the word lines WL and functions as the memory portions of the memory cells MC. The word lines WL function as control gates of the memory cells MC.

For example, charge is injected from the semiconductor layer 10 into the memory film 20 by a programming voltage applied between the semiconductor layer 10 and the word line WL. Data is programmed to the memory cell MC thereby. On the other hand, the charge is discharged from the memory film 20 into the semiconductor layer 10 by an erasing voltage applied between the semiconductor layer 10 and the word line WL. The data that is stored in the memory cell MC is erased thereby.

The memory film 20 includes, for example, a blocking insulating film 23, a charge retaining film 25, and a tunneling insulating film 27. The blocking insulating film 23 is positioned between the charge retaining film 25 and the word lines WL and blocks the movement of the charge from the word line WL into the charge retaining film 25. The tunneling insulating film 27 is positioned between the semiconductor layer 10 and the charge retaining film 25. The tunneling insulating film 27 has a thickness such that the charge can tunnel from the semiconductor layer 10 into the charge retaining film 25. The blocking insulating film 23 and the tunneling insulating film 27 are, for example, silicon oxide films. The charge retaining film 25 is, for example, a silicon nitride film.

The structure of the memory cell MC is not limited to the example and may be, for example, a floating gate structure. In other words, for example, floating gates of polysilicon may be disposed between the semiconductor layer 10 and the word lines WL instead of the charge retaining film 25. The floating gates are provided to surround the semiconductor layer 10 and are arranged discretely along the semiconductor layer 10. A tunneling insulating film is disposed between the semiconductor layer 10 and the floating gates; and a blocking insulating film is disposed between the floating gates and the word lines WL.

As shown in FIG. 1A, the end portions of the select gate SGS, the word lines WL, and the select gate SGD are patterned into a staircase configuration; and contact plugs CC are connected respectively to the end portions. For example, the word lines WL are connected to gate interconnects GL via the contact plugs CC and the connection plugs VC. On the other hand, the semiconductor layers 10 that are inside the columnar bodies CL are electrically connected to the source layer SL and the bit lines BL. Thus, the memory cells MC are connected to a not-illustrated drive circuit via the gate interconnects GL, the bit lines BL, and the source layer SL and are operated by voltages supplied from the drive circuit.

Figure 2:
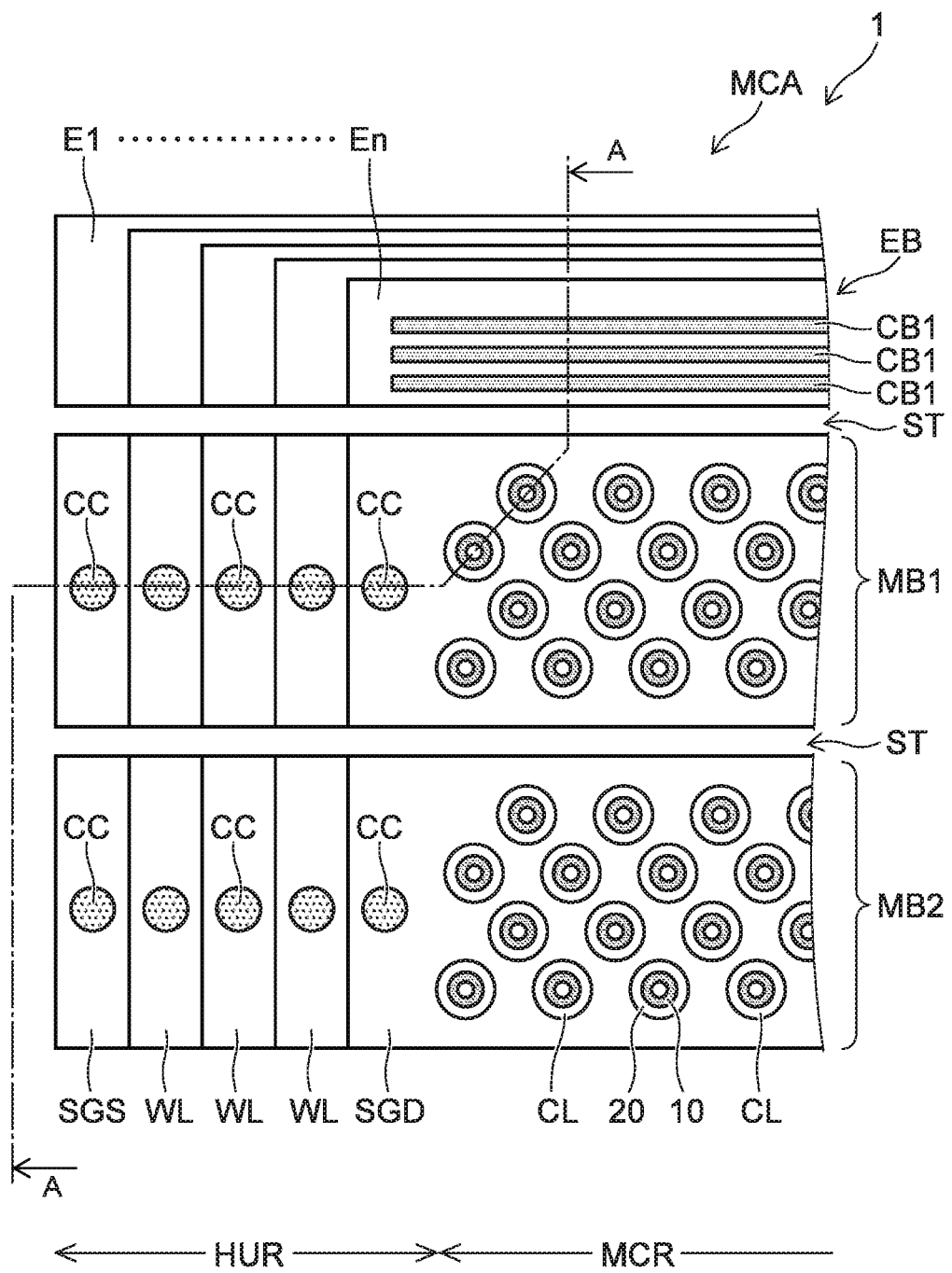
FIG. 2 is a schematic view showing the layout of the semiconductor memory device according to the first embodiment.

FIG. 2 is a schematic view showing the layout of the semiconductor memory device 1 according to the first embodiment. FIG. 2 illustrates the layout of the memory cell array MCA when viewed from above. The memory cell array MCA includes, for example, multiple memory blocks arranged in the Y-direction.

As shown in FIG. 2, a memory block MB1 and a memory block MB2 are arranged in the Y-direction with a slit ST extending in the X-direction interposed. The memory blocks MB1 and MB2 each include a memory cell region MCR and a draw-out region HUR.

The multiple columnar bodies CL are disposed in the memory cell region MCR. The not-illustrated multiple bit lines BL are disposed above the multiple columnar bodies CL; and each of the bit lines BL extends in the Y-direction crossing the slit ST (referring to FIG. 1A).

The draw-out region HUR includes the end portions of the select gate SGS, the word lines WL, and the select gate SGD patterned into the staircase configuration. The multiple contact plugs CC are provided in the draw-out region HUR; and the multiple contact plugs CC are connected respectively to the end portions of the select gate SGS, the word lines WL, and the select gate SGD.

The memory cell array MCA includes an end block EB arranged in the Y-direction with respect to the memory block MB1. The memory block MB1 and the end block EB also are separated by the slit ST. The end block EB includes conductors CB1. For example, the conductors CB1 are arranged in a line-and-space configuration extending in the X-direction.

Figure 3:
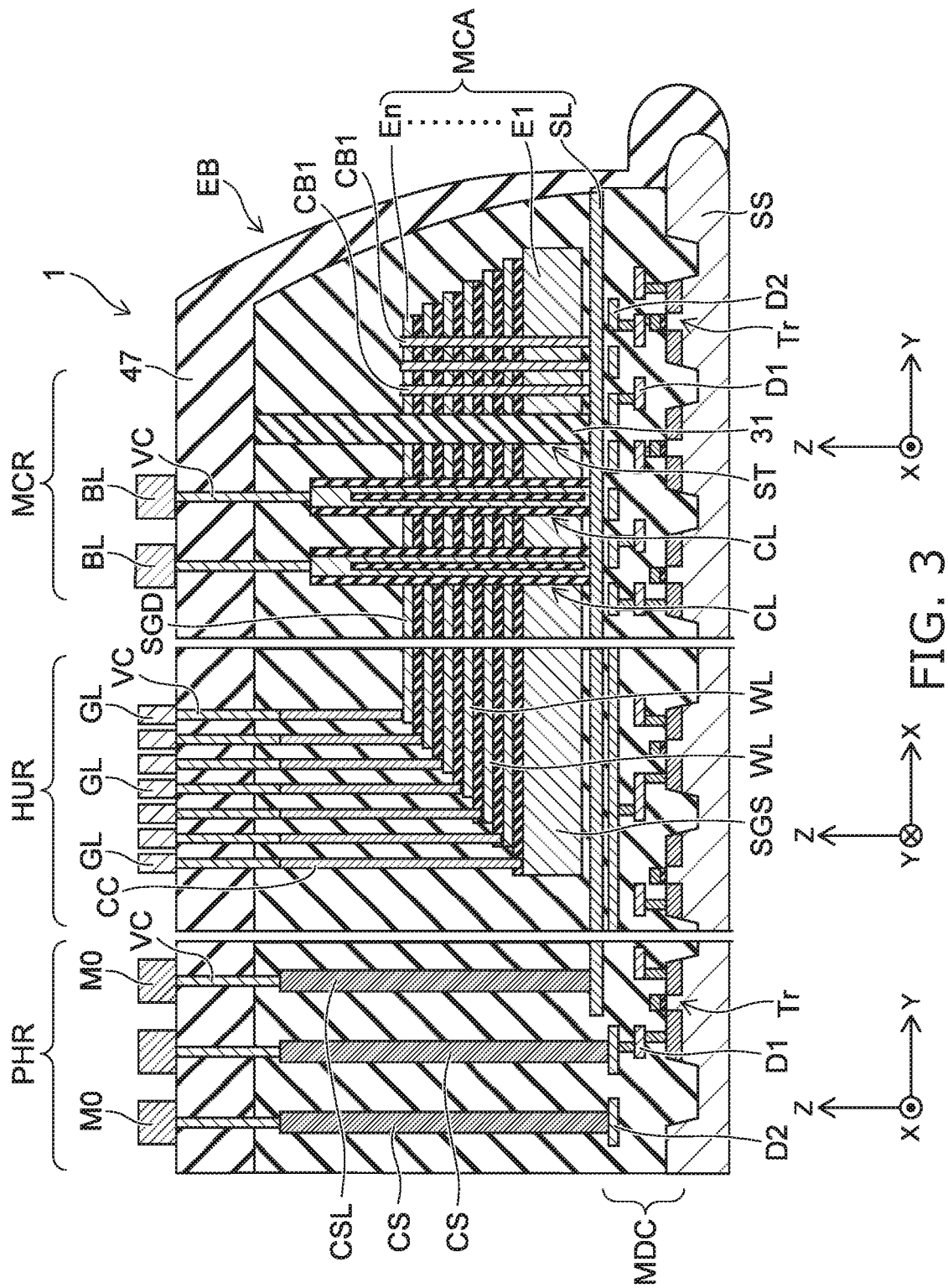
FIG. 3 is a schematic cross-sectional view showing the semiconductor memory device according to the first embodiment.

FIG. 3 is a schematic cross-sectional view showing the semiconductor memory device 1 according to the first embodiment. FIG. 3 illustrates a cross section along line A-A shown in FIG. 2. FIG. 3 illustrates a cross section of the end block EB, the memory cell region MCR, the draw-out region HUR, and a peripheral region PHR. The peripheral region PHR is a region surrounding the memory cell array MCA.

As shown in FIG. 3, the memory cell array MCA is provided above a semiconductor substrate SS. The semiconductor substrate SS is, for example, a silicon substrate. A circuit MDC that drives the memory cell array MCA is provided on the semiconductor substrate SS. The circuit MDC includes interconnects D1 and D2 and multiple transistors Tr provided in the surface layer of the semiconductor substrate SS. In the example, at least a portion of the circuit MDC is positioned between the semiconductor substrate SS and the memory cell array MCA. For example, the circuit MDC may be disposed in a peripheral region surrounding the memory cell array MCA or may be disposed above the memory cell array MCA.

The memory cell array MCA includes the source layer SL provided above the circuit MDC with an inter-layer insulating film interposed. The memory cell array MCA includes the select gate SGS, the word lines WL, and the select gate SGD disposed above the source layer SL in the memory cell region MCR and the draw-out region HUR.

The select gate SGS, the word lines WL, and the select gate SGD are arranged to be separated from each other above the source layer SL. For example, the select gate SGS, the word lines WL, and the select gate SGD are stacked in the Z-direction with inter-layer insulating films interposed. The select gate SGS is provided so that the thickness in the Z-direction is thicker than the thicknesses in the Z-direction of the word lines WL.

The end block EB is provided above the source layer SL. An insulating film 31 is disposed between the memory cell region MCR and the end block EB. The insulating film 31 is provided to fill the interior of the slit ST.

The end block EB includes electrode layers E1 to En arranged to be separated from each other above the source layer SL. The electrode layers E1 to En are stacked in the Z-direction with inter-layer insulating films interposed. The electrode layers E1 to En are arranged respectively at substantially the same levels as the levels in the Z-direction of the select gate SGS, the word lines WL, and the select gate SGD. The electrode layers E1 to En are electrically insulated from the select gate SGS, the word lines WL, and the select gate SGD by the insulating film 31.

As shown in FIG. 3, the end block EB includes the conductors CB1 extending in the Z-direction. Although three conductors CB1 are recited in FIG. 3, the end block EB may include one, two, four, or more conductors CB1. The conductors CB1 have lengths in the Z-direction that reach the source layer SL from the electrode layer En. The conductors CB1 are, for example, conductors having plate configurations extending in the X-direction and the Z-direction (referring to FIG. 2). The conductors CB1 electrically connect the electrode layers E1 to En to each other and are electrically connected to the source layer SL. The electrode layers E1 to En are connected in parallel to each other by the conductors CB1.

The semiconductor memory device 1 further includes contact plugs CS and CSL disposed in the peripheral region PHR. The contact plug CS is connected to the interconnect D2 of the circuit MDC. For example, the circuit MDC is electrically connected to interconnects MO via the contact plugs CS and the connection plugs VC. The contact plug CSL is connected to the source layer SL. The source layer SL is electrically connected to the interconnect MO via the contact plug CSL and the connection plug VC. The interconnects MO are arranged at substantially the same level as the level in the Z-direction of the bit lines BL and the gate interconnects GL.

For example, the source layer SL is electrically connected to the circuit MDC via the interconnect MO. Also, the bit lines BL and the gate interconnects GL are connected to the interconnects MO via not-illustrated upper layer interconnects and are electrically connected to the circuit MDC via the contact plugs CS. The circuit MDC includes, for example, row decoders, sense amplifiers, a bias circuit, etc., and drives the memory cell array MCA via the source layer SL, the word lines WL, the select gates SGS and SGD, and the bit lines BL.

A method for manufacturing the semiconductor memory device 1 will now be described with reference to FIG. 4A to FIG. 7B. FIG. 4A to FIG. 7B are schematic cross-sectional views showing the manufacturing processes of the semiconductor memory device 1 in order.

Figure 4A:
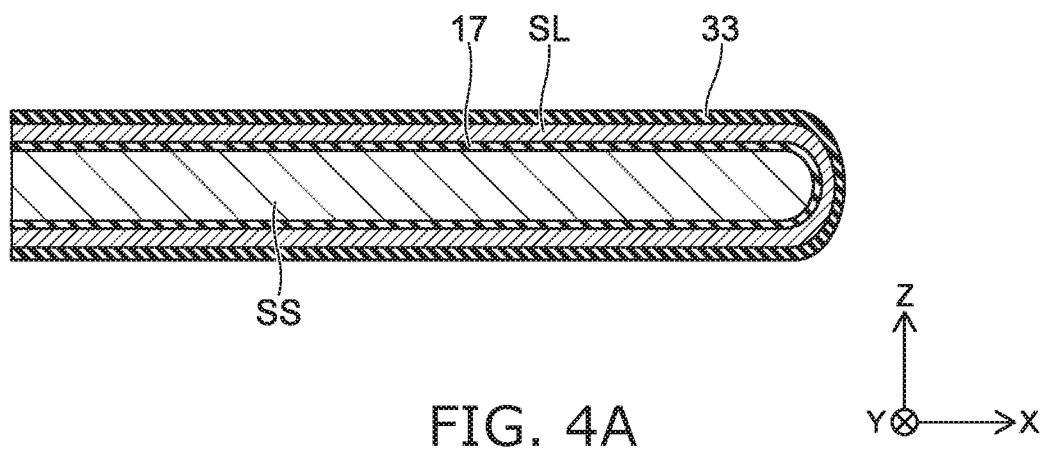
FIGS. 4A to 7B are schematic cross-sectional views showing a manufacturing processes of the semiconductor memory device according to the first embodiment.

As shown in FIG. 4A, the source layer SL is formed on the front surface of the semiconductor substrate SS with an insulating film 17 interposed. Continuing, an insulating film 33 that covers the source layer SL is formed. For example, the insulating film 17, the source layer SL, and the insulating film 33 are formed in order using CVD (Chemical Vapor Deposition). The insulating films 17 and 33 are, for example, silicon oxide films. The source layer SL is, for example, a conductive layer including polysilicon. The circuit MDC that is disposed on the semiconductor substrate SS (referring to FIG. 3) is not illustrated in FIG. 4A and the drawings showing subsequent processes.

Figure 4B:
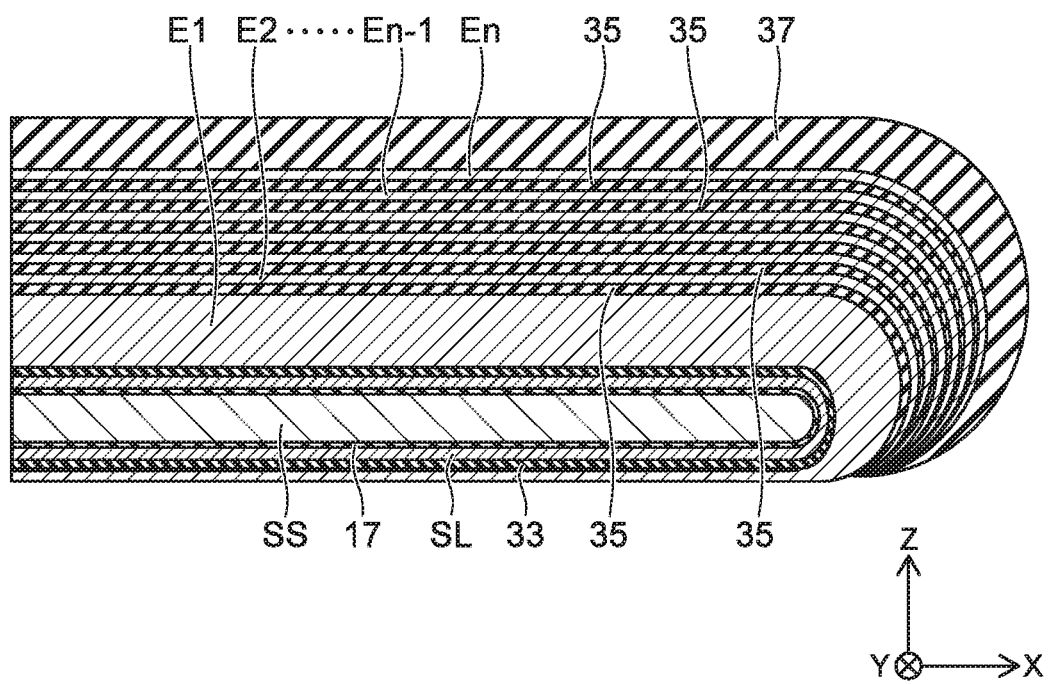

As shown in FIG. 4B, the electrode layers E1 to En are stacked on the insulating film 33. The electrode layers E1 to En are formed to be separated from each other with insulating films 35 interposed. Further, an insulating film 37 is formed on the electrode layer En. The electrode layers E1 to En are, for example, polysilicon layers that are conductive. The electrode layers E1 to En may be metal layers of tungsten (W), tungsten silicide (WSi), etc.

Figure 5A:
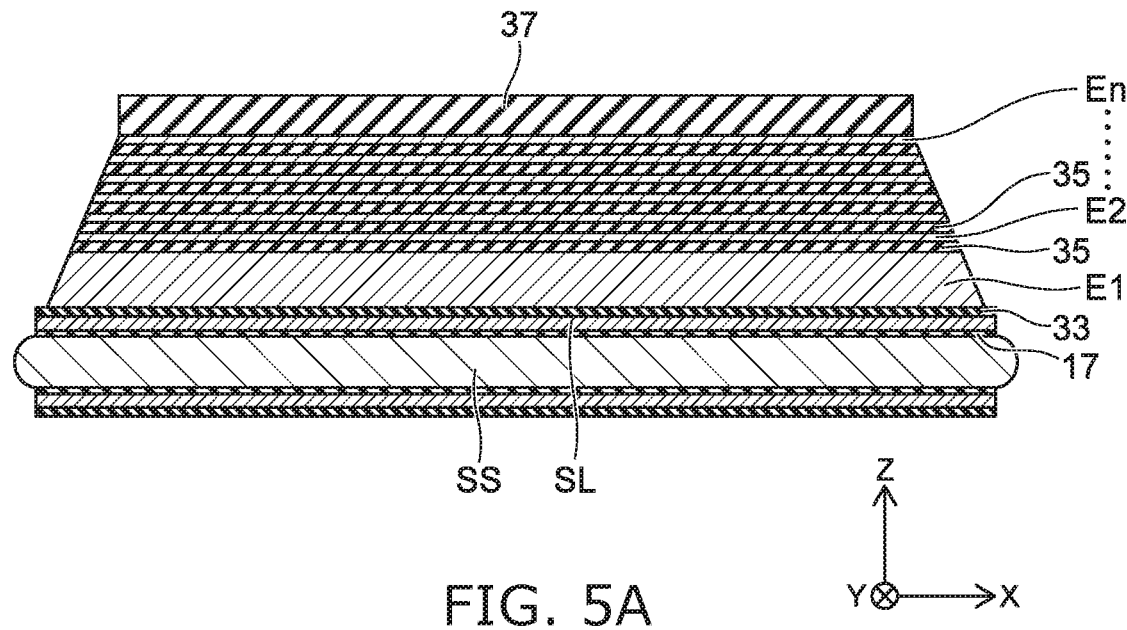

The electrode layer E1 is formed so that the layer thickness in the Z-direction is thicker than the thicknesses in the Z-direction of electrode layers E2 to En. The insulating films 35 and 37 are, for example, silicon oxide films. The insulating film 37 has a film thickness in the Z-direction that is thicker than the film thicknesses in the Z-direction of the insulating films 35. For example, the electrode layers E1 to En and the insulating films 35 and 37 are formed using plasma CVD As shown in FIG. 5A, the source layer SL, the insulating film 33, the electrode layers E1 to En, and the insulating films 35 and 37 that are formed on the end portion of the semiconductor substrate SS are selectively removed; and the end surfaces of the source layer SL and the electrode layers E1 to En are exposed. For example, the source layer SL, the insulating film 33, the electrode layers E1 to En, and the insulating films 35 and 37 are selectively removed by using RIE (Reactive Ion Etching) after forming a not-illustrated etching mask on the insulating film 37.

Figure 5B:
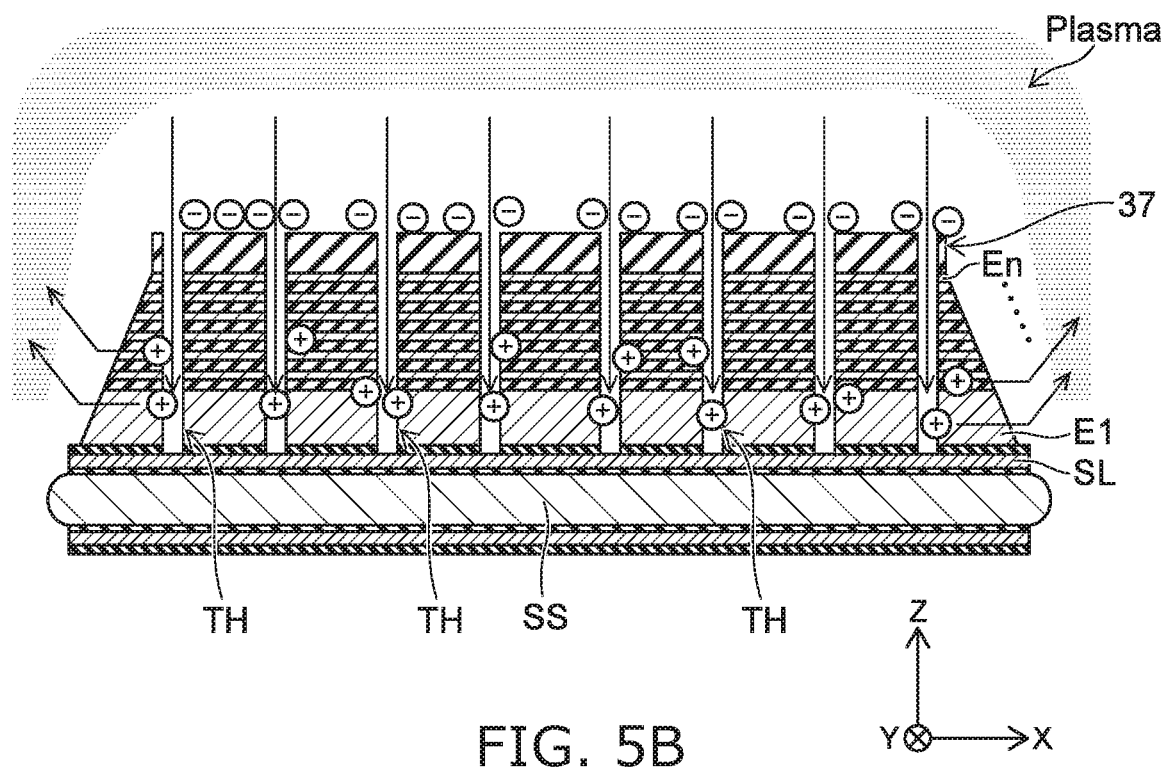

As shown in FIG. 5B, trenches TH that have depths that reach the source layer SL from the upper surface of the insulating film 37 are formed. When viewed in the top view, for example, the trenches TH are formed to have openings having stripe configurations extending in the X-direction. For example, the trenches TH are formed by selectively removing the insulating film 37, the electrode layers E1 to En, and the insulating films 33 and 35 by using a not-illustrated etching mask.

For example, the trenches TH are formed using anisotropic RIE. At this time, the semiconductor substrate SS is placed on a not-illustrated wafer holder. The wafer holder is biased to zero or a negative potential in a state in which the RIE plasma is excited. Therefore, radicals and/or ions which are plasma-excited species are attracted to the semiconductor substrate SS by the potential difference between the plasma and the wafer holder; and the etching of the insulating film 37, the electrode layers E1 to En, and the insulating films 33 and 35 progresses.

The electrode layers E1 to En are electrically insulated from each other; therefore, in the etching process, charge buildup of the electrode layers E1 to En occurs due to the electrode layers E1 to En receiving a positive charge from the ions. On the other hand, the positive charge is discharged into the plasma at the exposed end portions of the electrode layers E1 to En. Thereby, even in the case where the etching time of the electrode layers E1 to En is long, an unintended arc discharge due to charge buildup of the electrode layers E1 to En to a high potential can be avoided.

Figure 6A:
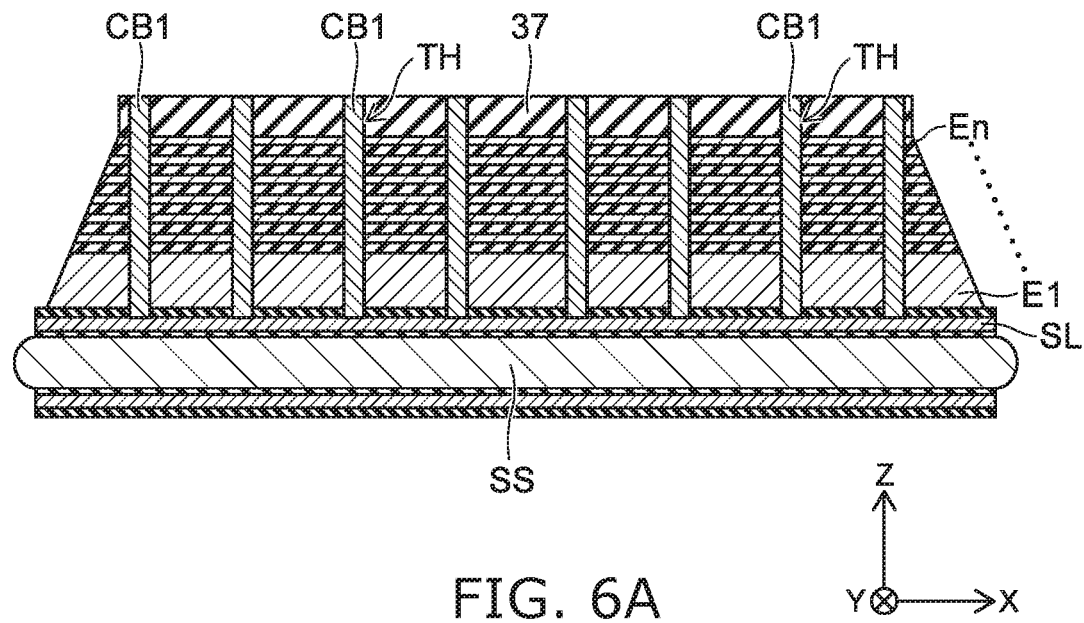

As shown in FIG. 6A, the conductor CB1 is formed in the interior of the trench TH and electrically connects the electrode layers E1 to En. The conductor CB1 is, for example, polysilicon formed as one body using CVD and is formed to have a thickness that plugs the trench TH. The conductor that is deposited on the upper surface of the insulating film 37, the end surfaces of the electrode layers E1 to En, and the end surface of the source layer SL is removed by, for example, isotropic dry etching. The conductor CB1 may be a metal such as tungsten (W), tungsten silicide (WSi), etc.

Figure 6B:
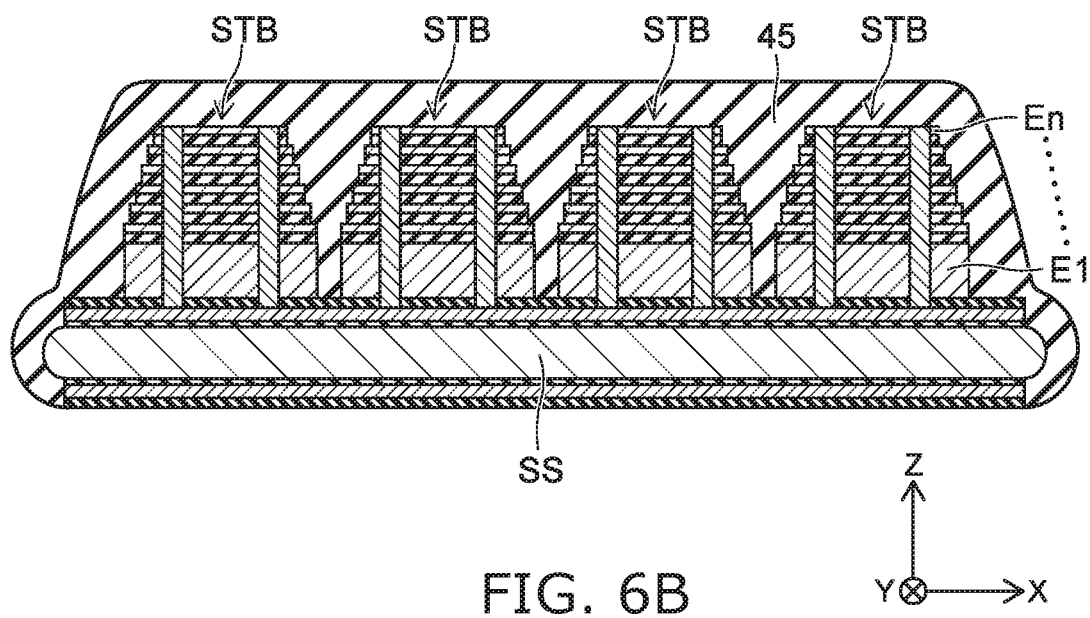

As shown in FIG. 6B, multiple stacked bodies STB that are used to form the memory cell arrays MCA are formed on the semiconductor substrate SS. For example, the multiple stacked bodies STB are separated by selectively removing the electrode layers E1 to En. At this time, the end portions of the electrode layers E1 to En are patterned in order from the electrode layer En to the electrode layer E1 to have a staircase configuration. The source layer SL is not divided and is shared by the multiple stacked bodies STB. Continuing, an insulating film 45 that covers the multiple stacked bodies STB is formed. The insulating film 45 is, for example, a silicon oxide film.

Figure 7A:
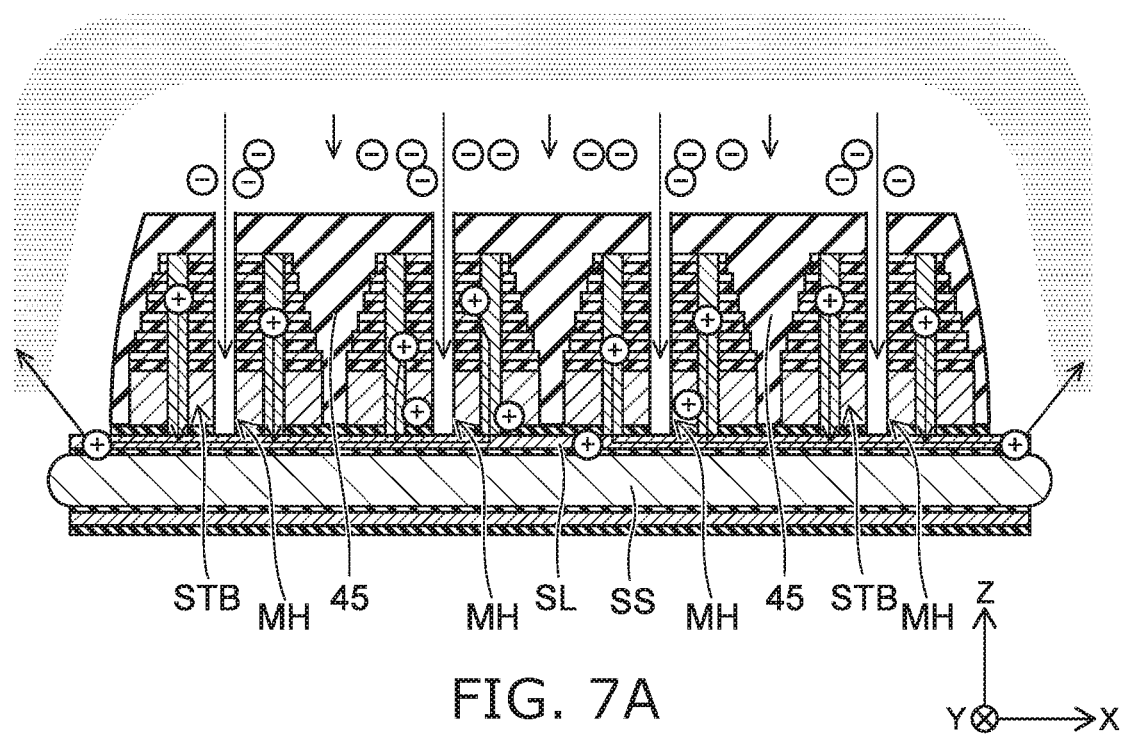

As shown in FIG. 7A, memory holes MH that have depths that pierce the stacked bodies STB from the upper surface of the insulating film 45 and reach the source layer SL are formed. The multiple memory holes MH are provided in each of the stacked bodies STB. Although one memory hole MH is shown for each of the stacked bodies STB for convenience in FIG. 7A, many not-illustrated memory holes are formed in each of the stacked bodies STB.

For example, the memory holes MH are formed using anisotropic RIE. Before this process, the insulating film 45 that covers the end portion of the source layer SL is removed; and the end portion of the source layer SL is exposed to the plasma. On the other hand, in the stacked bodies STB that are covered with the insulating film 45, the electrode layers E1 to En are electrically connected to each other via the conductor CB1. Also, the conductor CB1 is connected to the source layer SL. Accordingly, the positive charge that moves into the electrode layers E1 to En from the ions in the etching process of the electrode layers E1 to En can move into the source layer SL from the interiors of the electrode layers E1 to En. As a result, the positive charge due to the charge buildup of the electrode layers E1 to En is discharged into the plasma from the end portion of the source layer SL. Thereby, the charge buildup of the electrode layers E1 to En is suppressed; and, for example, an arc discharge between the electrode layers E1 to En and conductors inside the plasma chamber can be avoided.

Figure 7B:
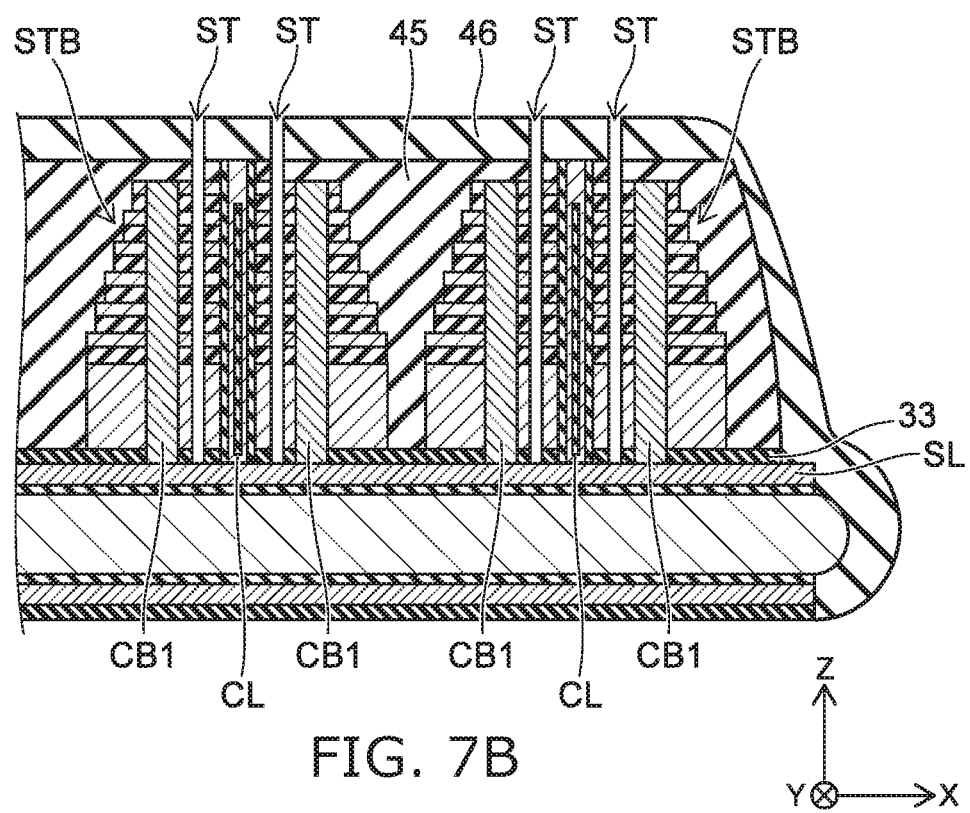

Continuing, the memory film 20, the semiconductor layer 10, and the insulating core 15 are formed in order in the interiors of the memory holes MH; and an insulating film 46 is formed to cover the insulating film 45 and the columnar bodies CL that each include the memory film 20, the semiconductor layer 10, and the insulating core 15. The insulating film 46 is, for example, a silicon oxide film. Subsequently, as shown in FIG. 7B, the slits ST that have depths that reach at least the insulating film 33 from the upper surface of the insulating film 46 are formed and divide the electrode layers E1 to En of each of the stacked bodies STB. Thereby, the multiple memory blocks MB1 and MB2 and the end block EB can be formed in each of the stacked bodies STB. Continuing, the insulating films 31 are formed in the interiors of the slits ST; and the interconnect layers that include the bit lines BL, the gate interconnects GL, etc., are formed above the insulating film 46. Subsequently, although not particularly illustrated, the semiconductor memory device 1 is completed by singulating the semiconductor substrate SS to correspond to the arrangement of the multiple stacked bodies STB respectively used to form the memory cell arrays MCA.

In the embodiment, the charge buildup of the electrode layers E1 to En is suppressed by providing the conductor CB1 electrically connecting the electrode layers E1 to En to each other. Thereby, for example, the arc discharge when forming the memory holes MH can be avoided. Also, the electrode layers E1 to En are electrically connected to each other by one body of the conductor CB1 after stacking of the electrode layers E1 to En; therefore, the conductor CB1 can be formed easily without drastic modifications of the manufacturing processes.

For example, in the case where the number of stacks of electrode layers is increased to increase the memory capacity of the memory device, the etching time lengthens; and the charge that moves into the electrode layers from the ions increases.

Therefore, in the case where the conductor CB1 is not formed, the likelihood of charge buildup to a high potential in the electrode layers is high. Accordingly, to avoid the arc discharge caused by the charge buildup, a method using a low power (a low bias) or a pulse etching method is used to perform the RIE processing. However, in these methods, it becomes difficult to form the memory holes MH vertically to the source layer SL. Also, the throughput of the formation process of the memory holes MH decreases. In the case where the electrode layers include a low-resistance metal, it is difficult to avoid the arc discharge even by using these methods.

According to the embodiment, the memory holes that pierce the multiple electrode layers can be formed easily; and the throughput of the manufacturing processes of the semiconductor memory device 1 can be improved. It is also possible to use a metal as the material of the electrode layers.

Figure 8A:
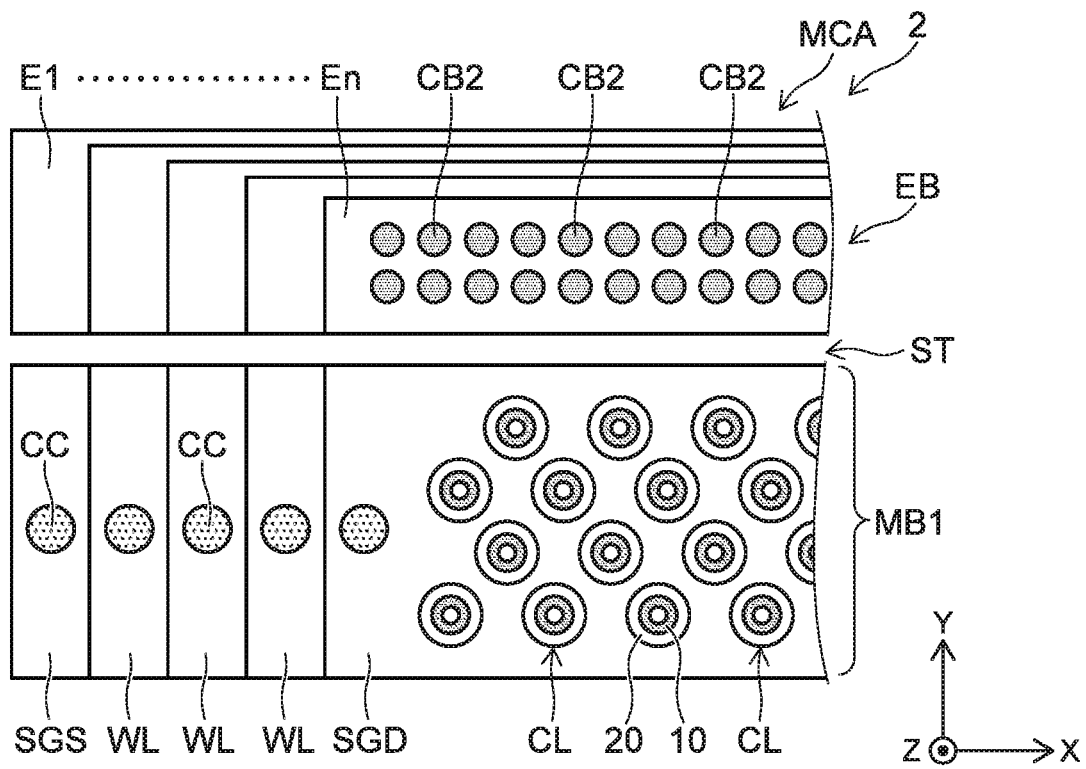
FIGS. 8A and 8B are schematic views showing layouts of semiconductor memory devices according to modifications of the first embodiment.
Figure 8B:
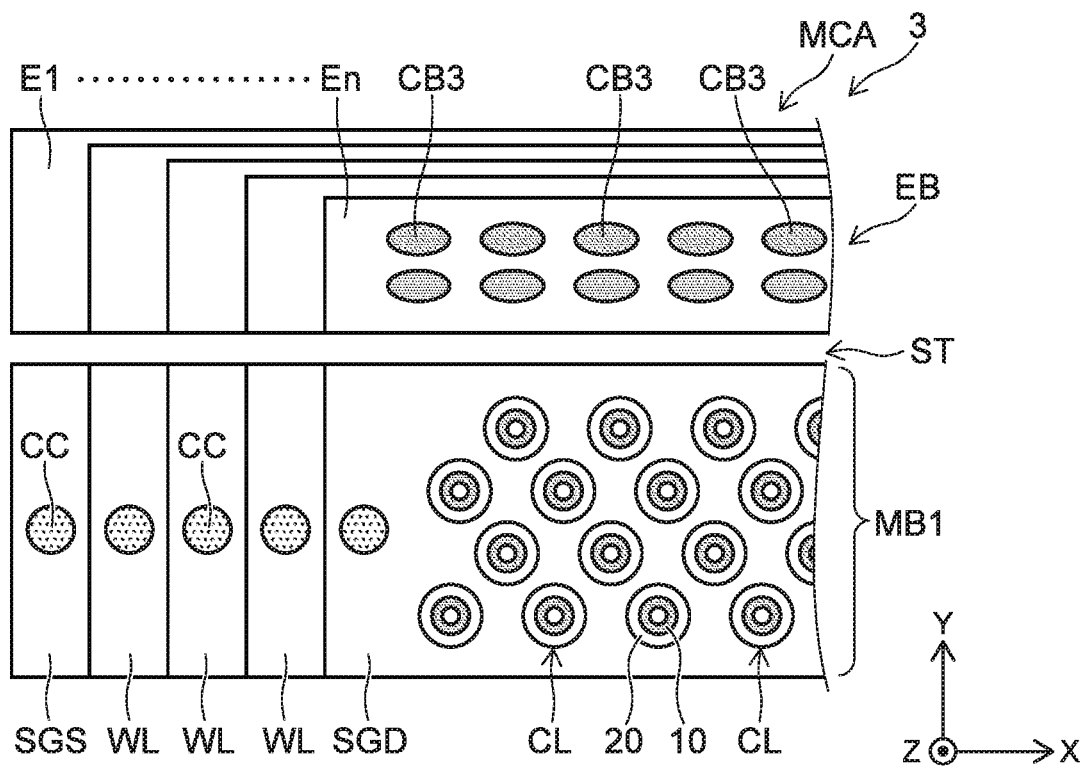

FIGS. 8A and 8B are schematic views showing layouts of semiconductor memory devices according to modifications of the first embodiment. In the memory cell arrays MCA of the semiconductor memory devices according to modifications of the first embodiment, the end block EB that is arranged in the Y-direction with respect to the memory block MB1 is included as well. The memory block MB1 and the end block EB are separated by the slit ST.

In the semiconductor memory device 2 shown in FIG. 8A, the end block EB includes multiple conductors CB2. The conductors CB2 have substantially circular configurations in a cross section along the upper surface of the electrode layer En. The conductors CB2 extend through the end block EB in the Z-direction and are filled into holes of which the cross sections have substantially circular configurations. The conductors CB2 electrically connect the electrode layers E1 to En to each other. The conductors CB2 are connected to the not-illustrated source layer SL. The conductors CB2 are arranged in the extension direction of the slit ST.

In the semiconductor memory device 3 shown in FIG. 8B, the end block EB includes multiple conductors CB3. The conductors CB3 have substantially elliptical configurations in the cross section along the upper surface of the electrode layer En. The conductors CB3 extend through the end block EB in the Z-direction and are filled into holes of which the cross sections have substantially elliptical configurations. The conductors CB3 electrically connect the electrode layers E1 to En to each other. The conductors CB3 are connected to the not-illustrated source layer SL. The conductors CB3 are arranged in the extension direction of the slit ST. Further, for example, the directions of the major diameters of the conductors CB3 in the cross section are aligned with the extension direction of the slit ST.

The conductors CB2 and CB3 of the semiconductor memory devices 2 and 3 can be formed densely enough that the charge buildup of the electrode layers E1 to En can be suppressed; for example, it is possible to avoid the arc discharge when forming the memory holes MH.

Second Embodiment

Figure 9:
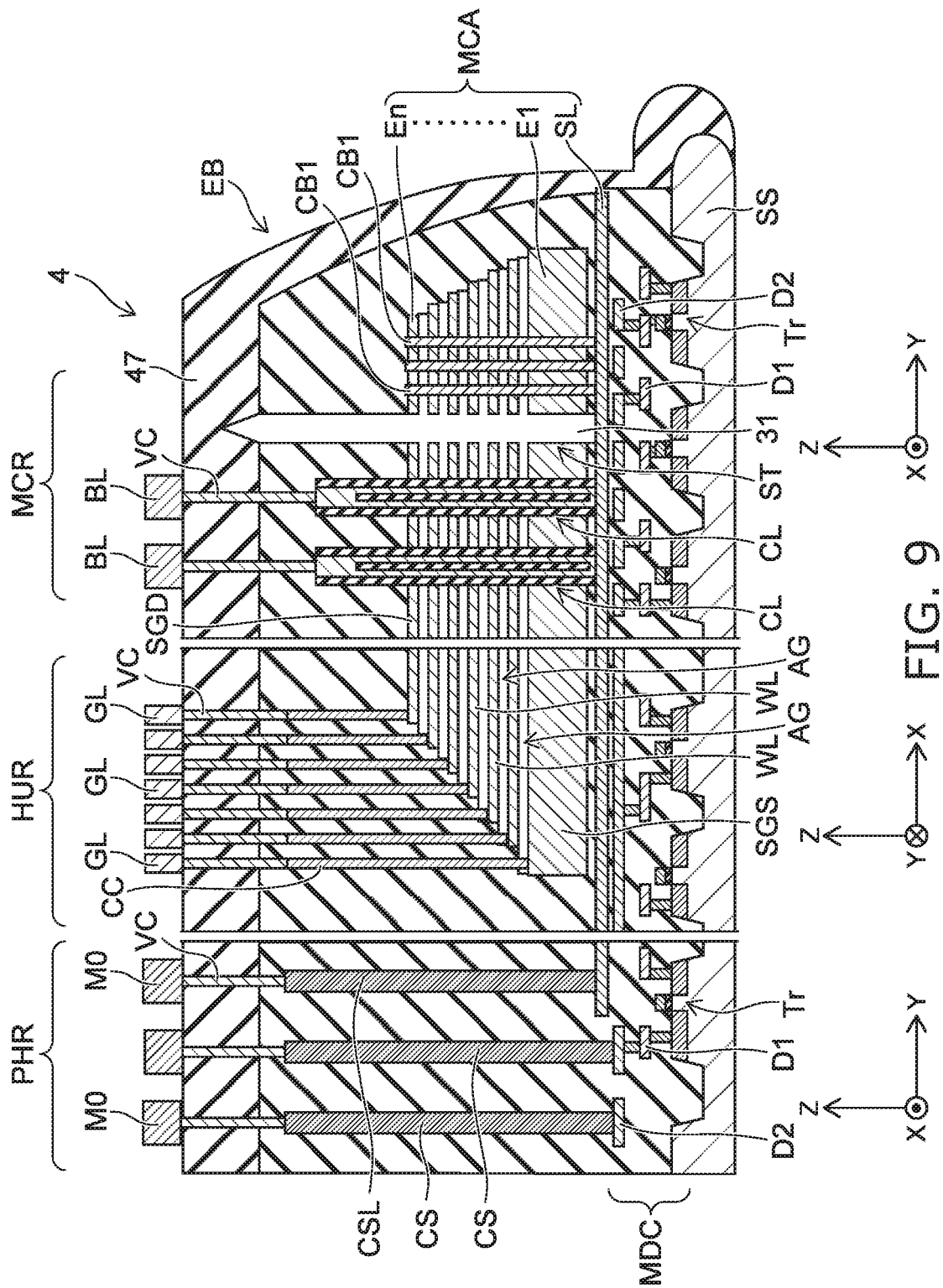
FIG. 9 is a schematic cross-sectional view showing a semiconductor memory device according to a second embodiment.

FIG. 9 is a schematic cross-sectional view showing a semiconductor memory device according to a second embodiment. The semiconductor memory device 4 shown in FIG. 9 includes the memory cell array MCA provided above the semiconductor substrate SS. The memory cell array MCA includes the source layer SL and the multiple electrode layers disposed to be separated from each other above the source layer SL.

The multiple electrode layers include the select gate SGS, the word lines WL, the select gate SGD, and the electrode layers E1 to En. The select gate SGS, the word lines WL, and the select gate SGD are provided in the memory cell region MCR and the draw-out region HUR and are disposed to be separated from each other in the Z-direction. Air gaps AG are provided between the select gate SGD and the word line WL, between the word lines WL, and between the word line WL and the select gate SGD.

The electrode layers E1 to En are included in the end block EB and disposed to be separated from each other in the Z-direction. The electrode layer E1 is positioned at substantially the same level as the level of the select gate SGS in the Z-direction. The electrode layers E2 to En-1 are positioned at substantially the same levels as the levels in the Z-direction of the respective multiple word lines WL. The electrode layer En is positioned at substantially the same level as the level of the select gate SGD in the Z-direction.

The slit ST is provided between the electrode layer E1 and the select gate SGS, between the electrode layers E2 to En-1 and the word lines WL, and between the electrode layer En and the select gate SGD. A gap that communicates with the air gaps AG remains in the interior of the slit ST.

The memory cell array MCA further includes the columnar bodies CL and the conductors CB1. The columnar bodies CL pierce the select gate SGS, the word lines WL, and the select gate SGD and extend in the Z-direction. The conductors CB1 are provided to extend inside the end block EB and electrically connect the electrode layers E1 to En to each other. The conductors CB1 are connected to the source layer SL.

The air gaps AG are formed by selectively removing, via the slit ST, sacrificial layers provided between the electrode layers used to form the select gate SGS, the word lines WL, the select gate SGD, and the electrode layers E1 to En. For example, an insulating film 47 is formed above the slit ST to plug the upper end side of the slit ST so that the gap remains in the interior of the slit ST.

By providing the air gaps AG in the embodiment, the spacing in the Z-direction between the select gate SGD and the word line WL, the spacing in the Z-direction between the word lines WL, and the spacing in the Z-direction between the word line WL and the select gate SGD can be set to be narrow while maintaining the prescribed insulation breakdown voltage. Thereby, it is possible to reduce the size in the Z-direction of the memory cell array MCA. Thereby, the enlargement of the size in the Z-direction of the memory cell array MCA as the number of stacks of electrode layers is increased can be suppressed. By providing the conductors CB1, an unintended arc discharge when forming the memory holes MH piercing the multiple electrode layers can be avoided.

Although an example is described in the first and second embodiments in which the conductors CB1 to CB3 are connected to the source layer SL, this is not limited thereto. For example, the conductors CB1 to CB3 may pierce the source layer SL and may be connected to the semiconductor substrate SS. In such a case, the source layer SL also is divided by the slit ST after forming the columnar bodies CL.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor memory device, comprising:
    a substrate;
    a plurality of first electrode layers arranged above the substrate, the plurality of first electrode layers being separated from each other in a first direction crossing an upper surface of the substrate;
    a semiconductor layer extending through the plurality of first electrode layers in the first direction;
    a plurality of second electrode layers arranged to be separated from each other in the first direction, arranged to be separated from the plurality of first electrode layers in a second direction crossing the first direction, and arranged at substantially the same levels as levels of the plurality of first electrode layers in the first direction; and
    a conductor electrically connecting the plurality of second electrode layers to each other, the plurality of second electrode layers being connected in parallel by the conductor.

2. The device according to claim 1, further comprising a conductive layer disposed between the substrate and the plurality of first electrode layers and electrically connected to the semiconductor layer,
    the conductor being electrically connected to the conductive layer.

3. The device according to claim 2, further comprising:
    a circuit electrically connected to a memory cell array, the memory cell array including memory cells provided at crossing portions of the semiconductor layer and the plurality of first electrode layers, respectively.

4. The device according to claim 3, wherein the conductive layer is a source layer included in the memory cell array.

5. The device according to claim 1, wherein the conductor extends through the plurality of second electrode layers in the first direction.

6. The device according to claim 5, wherein
    the plurality of first electrode layers and the plurality of second electrode layers extend in a third direction crossing the first direction and the second direction, and
    the conductor is provided in a plate configuration spreading in the first direction and the third direction.

7. The device according to claim 5, wherein the conductor has a substantially circular or elliptical configuration in a cross section crossing the first direction at one second electrode layer of the plurality of second electrode layers.

8. The device according to claim 1, wherein the plurality of first electrode layers and the plurality of second electrode layers include the same material.

9. The device according to claim 8, wherein the plurality of first electrode layers and the plurality of second electrode layers include silicon.

10. The device according to claim 8, wherein the plurality of first electrode layers and the plurality of second electrode layers include a metal.

11. The device according to claim 1, further comprising an insulating film filled into a space having a slit configuration between the plurality of first electrode layers and the plurality of second electrode layers, the insulating film electrically insulating the plurality of first electrode layers and the plurality of second electrode layers.

12. The device according to claim 1, wherein air gaps are arranged respectively between the plurality of first electrode layers.

13. The device according to claim 12, wherein a gap communicating with the air gaps is provided between the plurality of first electrode layers and the plurality of second electrode layers.

14. The device according to claim 1, further comprising:
    interconnects disposed above the plurality of first electrode layers,
    the semiconductor layer being electrically connected to one of the interconnects via a connection plug directly above the semiconductor layer, the connection plug extending in the first direction, the conductor being not connected to other one of the interconnects directly above the conductor at a level above the plurality of second electrode layers.

15. A semiconductor memory device, comprising:
    a substrate;

a plurality of first electrode layers arranged above the substrate, the plurality of first electrode layers being separated from each other in a first direction crossing an upper surface of the substrate;

a semiconductor layer extending through the plurality of first electrode layers in the first direction;

a plurality of second electrode layers arranged to be separated from each other in the first direction, arranged to be separated from the plurality of first electrode layers in a second direction crossing the first direction, and arranged at substantially the same levels as levels of the plurality of first electrode layers in the first direction; and a conductor of one body electrically connecting the plurality of second electrode layers to each other, the plurality of second electrode layers including second electrode layers disposed at three or more levels in the first direction, the conductor of one body electrically connecting the second electrode layers at the three or more levels to each other.

16. The device according to claim 15, further comprising:

a conductive layer disposed between the substrate and the plurality of first electrode layers, the conductive layer being electrically connected to the semiconductor layer, the conductor being electrically connected to the conductive layer.

* * * * *